US012652763B2

(12) United States Patent
　　　Li

(10) Patent No.:　US 12,652,763 B2
(45) Date of Patent:　Jun. 9, 2026

(54) ANTI-FALLING MOBILE POWER SUPPLY

(71) Applicant: Wenjie Li, Guangzhou (CN)

(72) Inventor: Wenjie Li, Guangzhou (CN)

( * ) Notice: Subject to any disclaimer, the term of this patent is extended or adjusted under 35 U.S.C. 154(b) by 123 days.

(21) Appl. No.: 18/640,398

(22) Filed: Apr. 19, 2024

(65) Prior Publication Data

US 2025/0194024 A1　Jun. 12, 2025

(30) Foreign Application Priority Data

Dec. 8, 2023　(CN) .......................... 202323352724.6

(51) Int. Cl.
　　*H05K 5/00*　(2025.01)
　　*H02J 7/70*　(2026.01)
(52) U.S. Cl.
　　CPC .............. *H05K 5/0086* (2013.01); *H02J 7/70* (2026.01)
(58) Field of Classification Search
　　CPC ............. H01M 50/247; H01M 50/202; H01M 50/242; H01M 50/233; H02J 7/0042; H05K 5/0086; F16F 15/08
　　See application file for complete search history.

(56) References Cited

U.S. PATENT DOCUMENTS

| | | | |
|---|---|---|---|
| 10,822,151 B2 * | 11/2020 | Kim ..................... | B65D 81/052 |
| 2013/0331155 A1 * | 12/2013 | Tages ................... | H04M 1/185 455/575.8 |

| | | | |
|---|---|---|---|
| 2017/0075390 A1 * | 3/2017 | Hao ..................... | B29D 99/006 |
| 2023/0369700 A1 * | 11/2023 | Kawakami .......... | H01M 50/256 |
| 2024/0023255 A1 * | 1/2024 | Wang ..................... | G09F 9/301 |
| 2024/0097732 A1 * | 3/2024 | Zhang ................... | H04M 1/18 |
| 2025/0015413 A1 * | 1/2025 | Bannai ................ | H01M 50/284 |

FOREIGN PATENT DOCUMENTS

| | | | |
|---|---|---|---|
| CN | 111726445 A | | 9/2020 |
| CN | 218415877 U | * | 1/2023 |

OTHER PUBLICATIONS

Machine Translation for CN218415877U (Year: 2025).*

* cited by examiner

*Primary Examiner* — Sagar Shrestha
*Assistant Examiner* — Peter Krim

(57)　　　ABSTRACT

The present disclosure relates to an anti-falling mobile power supply, including a shell and an energy storage unit, the shape of the shell is a cuboid, each of the four short edges of the shell is all detachably provided with an air bag soft body, the front side and rear side of the shell are all detachably provided with a carbon fiber fixing sheet, the energy storage unit is provided in the shell, the top of the shell is provided with an interface and a switch, and the interface and the switch are electrically connected with the energy storage unit. The present disclosure is ingenious in structure, through arrangement of the air bag soft body and the carbon fiber fixing sheet, elements inside may be protected during fall off.

8 Claims, 6 Drawing Sheets

ANTI-FALLING MOBILE POWER SUPPLY

CROSS-REFERENCE TO RELATED APPLICATIONS

The application claims priority of Chinese patent application CN202323352724.6, filed on Dec. 8, 2023, which is incorporated herein by reference in its entireties.

TECHNICAL FIELD

The present disclosure herein relates to the technical field of mobile power supplies, and in particular to an anti-falling mobile power supply.

BACKGROUND

A mobile power supply is a portable energy storage device, which has now been widely used, mainly in some places without external power supply, to charge electronic devices (such as a mobile phone). The mobile power supply is small in size, and a shell is generally plastic material, whereby it easily falls off in use, meanwhile, due to its poor protection property and a hard shell in general, the shell may be damaged when it falls off, and electronic elements in the shell cannot be protected.

SUMMARY

Aiming at the deficiencies in the relevant art, the present disclosure provides an anti-falling mobile power supply, which is ingenious in structure and may protect elements inside during falling or colliding.

In order to solve the above-mentioned technical problems, the technical solution adopted by the present disclosure is as follows.

An anti-falling mobile power supply includes a shell and an energy storage unit, the shape of the shell is a cuboid, each of the four short edges of the shell is all detachably provided with an air bag soft body, the front side and rear side of the shell are all detachably provided with a carbon fiber fixing sheet, the energy storage unit is provided in the shell, the top of the shell is provided with an interface and a switch, and the interface and the switch are electrically connected with the energy storage unit.

Furthermore, each of the four short edges of the shell is provided with a gap, and after the shell and all the air bag soft bodies are combined, a complete cuboid is formed.

Furthermore, the shell includes an upper shell body and a lower shell body, and the upper shell body and the lower shell body are detachably connected.

Furthermore, the upper surface of the lower shell body is open, the bottom of the upper shell body is provided with an inserting part, the inserting part is arranged to be inserted into the upper part of the lower shell body, the outer side of the inserting part is provided with a plurality of first buckles and a plurality of first clamping grooves, the upper part of the lower shell body is provided with a plurality of second clamping grooves and a plurality of second buckles, the second clamping groove is matched with the first buckle, and the second buckle is matched with the first clamping groove.

Furthermore, the upper part of the lower shell body is provided with a plurality of strip-shaped grooves, the strip-shaped groove is vertically provided, the outer side of the inserting part is provided with a strip-shaped bulge, and the strip-shaped bulge is matched with the strip-shaped groove.

Furthermore, assembly grooves are formed in two sides of the top end of the upper shell body, assembly grooves are formed in two sides of the bottom end of the lower shell body, the air bag soft body is provided with an assembly part, and the assembly part is arranged to be inserted into the assembly groove.

Furthermore, the air bag soft body includes a support part and a flexible part, the flexible part is provided with the outer side of the support part in a covering mode, the support part and the flexible part is provided with a hollow area, the support part is provided with an assembly part, and the assembly part is arranged to be inserted into the assembly groove in the shell.

Furthermore, the support part is made of a PC material, and the flexible part is made of a silica gel material.

Furthermore, the front side and rear side of the lower shell body are all provided with a fixing groove, and the carbon fiber fixing sheet is bonded in the fixing groove.

Furthermore, the fixing groove is provided with a plurality of key-shaped bulges, the carbon fiber fixing sheet is provided with a plurality of key-shaped holes, and the key-shaped bulge is matched with the key-shaped hole.

With the adoption of the technical solution, compared with the relevant art, the present disclosure has the following advantages.

The present disclosure is reasonable in structure, the air bag soft body is provided at four corners of the shell, when the power supply falls off at any angle, the air bag soft body contact ground first, impact is buffered through deformation of the air bag soft body, meanwhile, when the air bag soft body deform, air in the hollow area inside the air bag soft body may be compressed, thereby achieving the purpose of shock absorption and falling prevention.

Through the carbon fiber fixing sheet on the front side and rear side of the shell, as carbon fiber has the property of strong tensile capacity, the elastic modulus (for measuring deformation resistance of a material) of the carbon fiber is 150-760 GPa, so that after the carbon fiber is connected with the shell through a key structure, the longitudinal and transverse impact resistance of the shell may be well enhanced, impact may be absorbed during falling, then elements in the shell are protected, the anti-falling effect is achieved, and meanwhile, due to the property of low density of the carbon fiber material, the weight of the product may be reduced.

The present disclosure will be described in detail below with reference to drawings and embodiments.

DETAILED DESCRIPTION OF THE EMBODIMENTS

Figure 1:
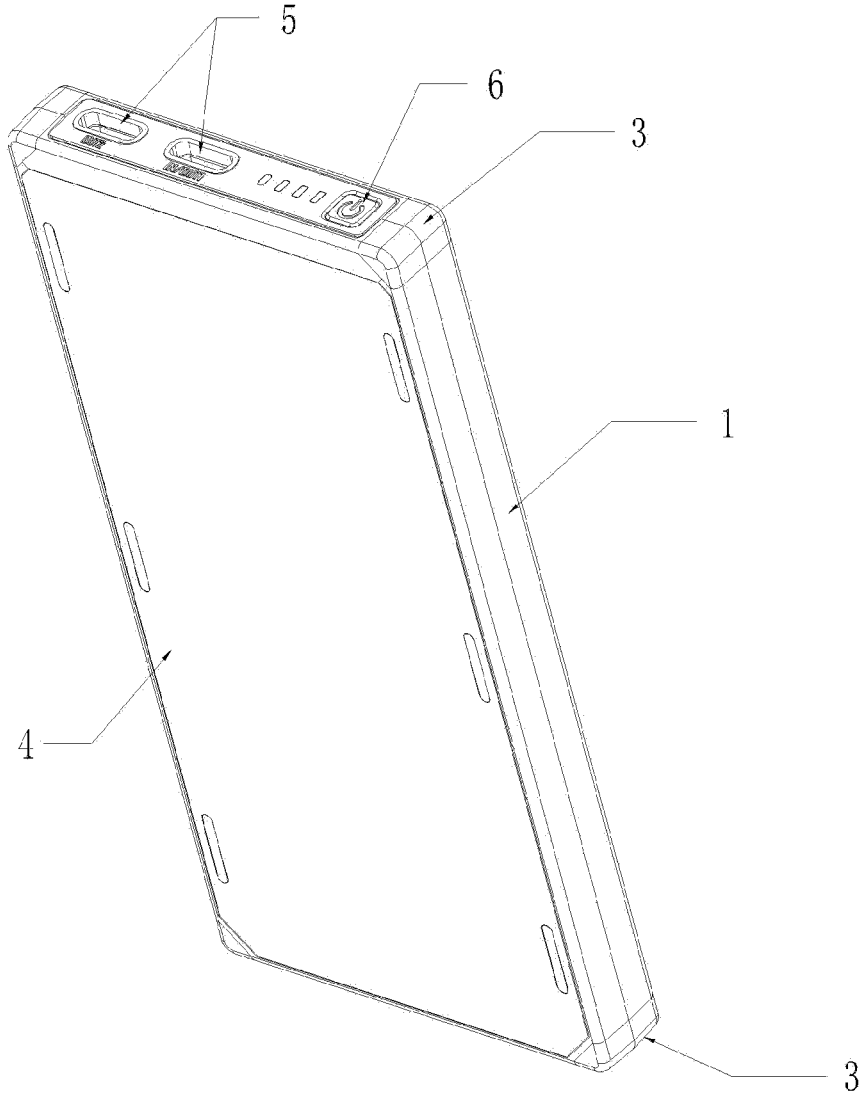
FIG. 1 is a schematic structure diagram of a three-dimensional view of the present disclosure.

The principle and features of the present disclosure will be described below with reference to the drawings, and examples described herein are for the purpose of explaining the present disclosure only and are not intended to limit the scope of the present disclosure.

In the description of the present disclosure, it is to be understood that orientation or position relationships indicated by terms "center", "upper", "lower", "left", "right", "vertical", "horizontal", "inner", "outer", "clockwise", "counterclockwise" and the like are orientation or position relationships shown in the drawings, are adopted not to indicate or imply that indicated devices or elements must be in specific orientations or structured and operated in specific orientations but only to conveniently and simply describe the present disclosure and thus should not be understood as limits to the present disclosure.

Embodiment 1 as shown in FIG. 1, an anti-falling mobile power supply includes a shell 1 and an energy storage unit 2, the shape of the shell 1 is a cuboid, each of the four short edges of the shell 1 is all detachably provided with an air bag soft body 3, the front side and rear side of the shell 1 are all detachably provided with a carbon fiber fixing sheet 4, the energy storage unit 2 is provided in the shell 1, the top of the shell 1 is provided with an interface 5 and a switch 6, and the interface 5 and the switch 6 are electrically connected with the energy storage unit 2.

Embodiment 2 the embodiment is improved on the basis of Embodiment 1, and the improvement point is the structure of the shell 1.

Figure 2:
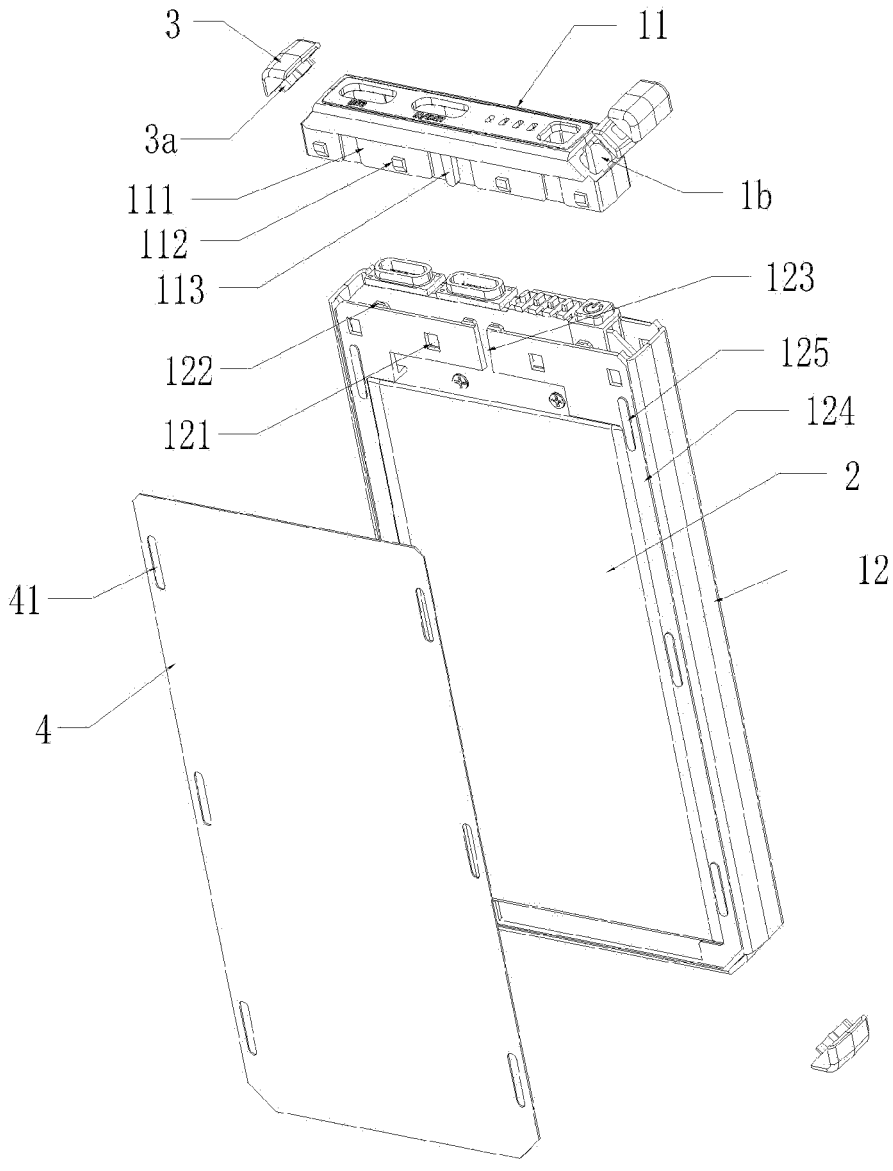
FIG. 2 is a schematic diagram of an exploded view of the present disclosure.
Figure 3:
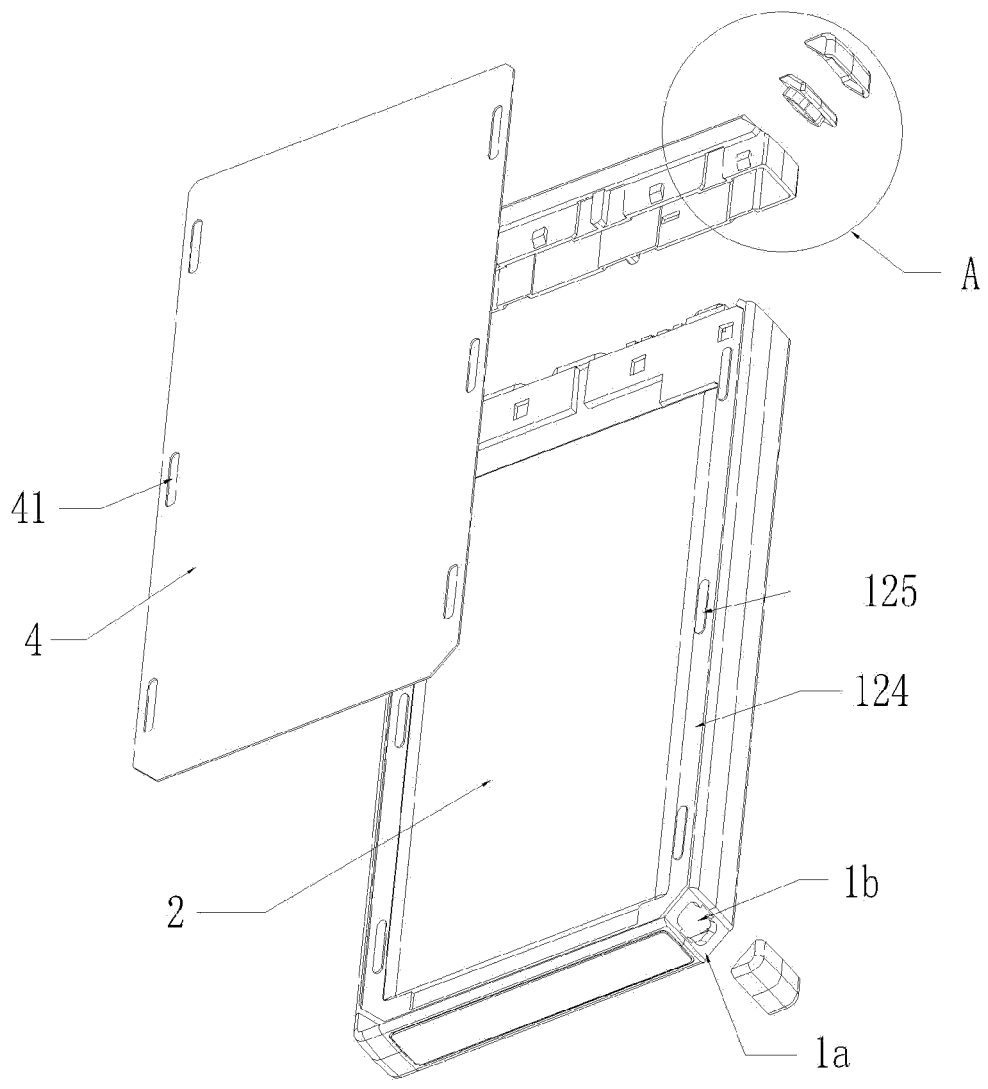
FIG. 3 is a schematic diagram of an exploded view at another angle of the present disclosure.
Figure 4:
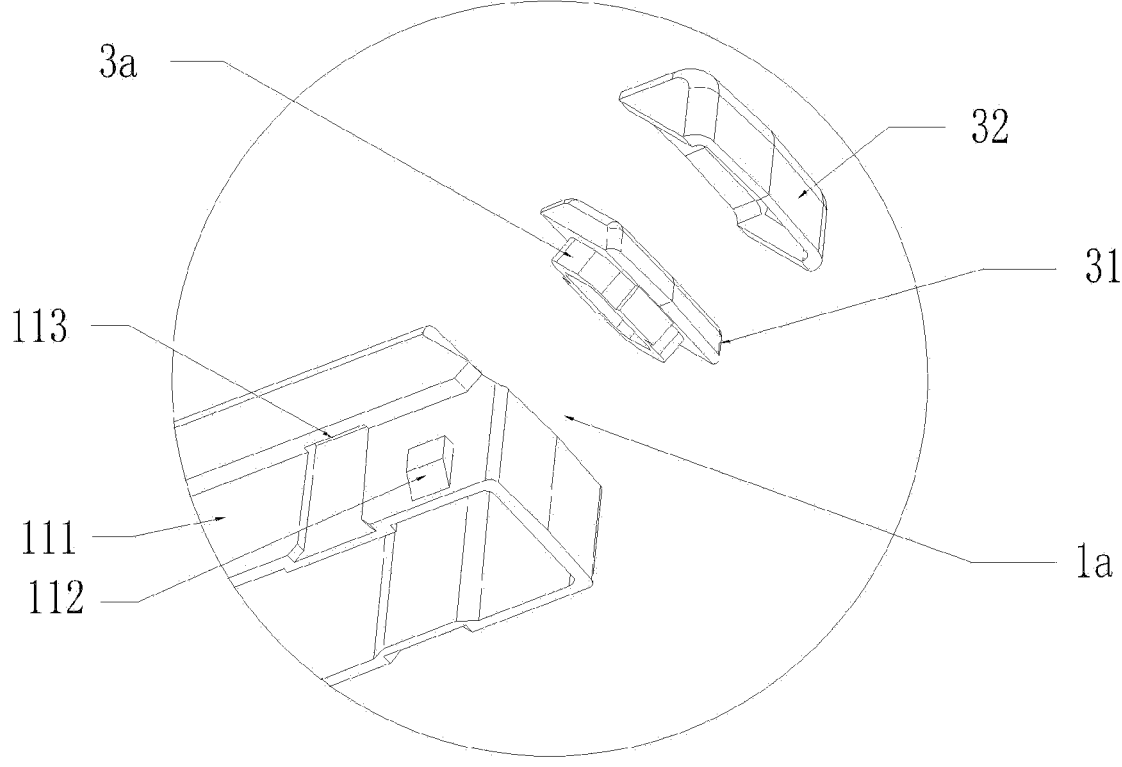
FIG. 4 is a schematic diagram of an enlarged view of A in FIG. 3.

As shown in FIGS. 2, 3 and 4, in the embodiment, the shell 1 is composed of an upper shell body 11 and a lower shell body 12, the upper surface of the lower shell body 12 is open, the bottom of the upper shell body 11 is provided with an inserting part 111, the inserting part 111 is arranged to be inserted into the lower shell body 12 from the top of the lower shell body 12, the outer side of the inserting part 111 is provided with a plurality of first buckles 112 and a plurality of first clamping grooves 113, the upper part of the lower shell body 12 is provided with a plurality of second clamping grooves 121 and a plurality of second buckles 122, the second clamping groove 121 is matched with the first buckle 112, and the second buckles 122 are matched with the first clamping grooves 113.

Specifically, each of the front side and rear side of the inserting part 111 is provided with four first buckles 112 and four first clamping grooves 113, meanwhile, the inserting part 111 is provided with a guide section communicating with the first clamping groove 113, each of the front side of the upper part and the rear side of the upper part of the lower shell body 12 is provided with four second clamping grooves 121, and each of the front side of the top end and the rear side of the top end of the lower shell body 12 is provided with four second buckles 122.

The top of the lower shell body 12 is provided with a vertical strip-shaped groove 123, and the outer side of the inserting part 111 is provided with a strip-shaped bulge 114 matched with the strip-shaped groove 123.

When the upper shell body 11 and the lower shell body 12 are connected, first, the strip-shaped bulge 114 is aligned with the strip-shaped groove 123, the second buckle 122 is aligned with the guide section, then the upper shell body 11 and the lower shell body 12 are combined until all the first buckles 112 are clamped in the second clamping grooves 121 and all the second buckles 122 are clamped into the first clamping grooves 113, thus completing assembly of the upper shell body 11 and the lower shell body 12.

Embodiment 3 the embodiment is improved on the basis of Embodiment 1 or Embodiment 2, specifically, relating to the structure of the shell 1, the structure of the air bag soft body 3 and the structure of the carbon fiber fixing sheet 4.

Figure 5:
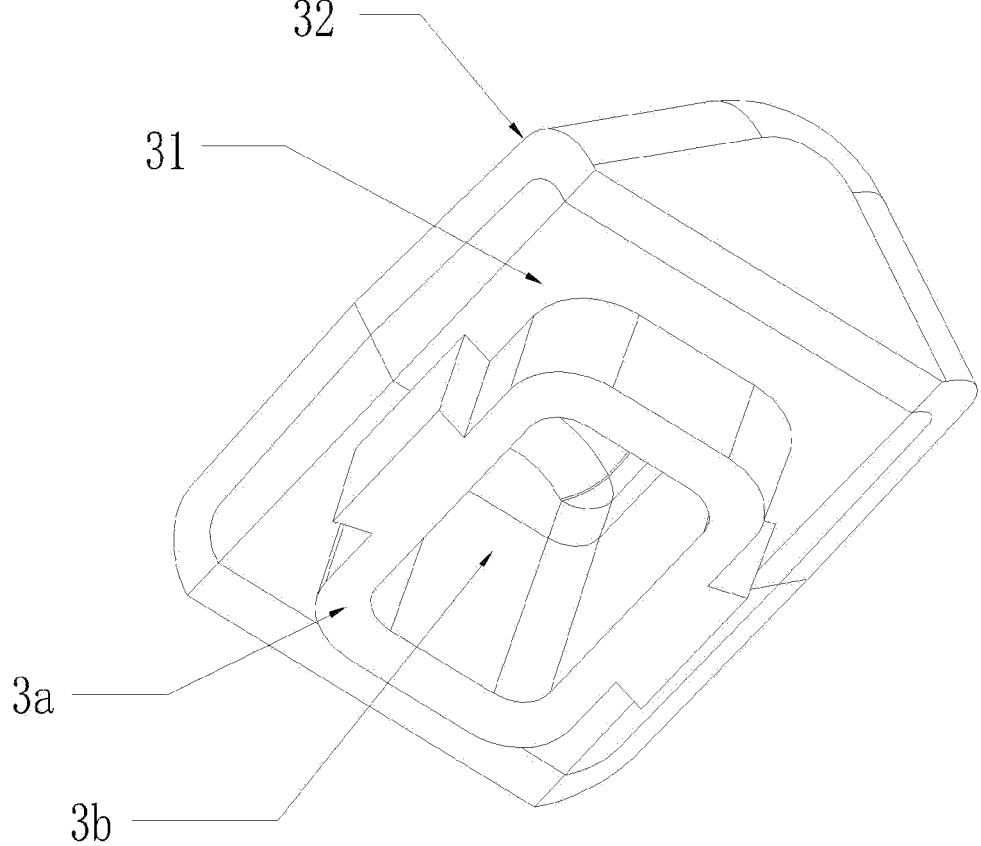
FIG. 5 is a schematic structure diagram of an air bag soft body of the present disclosure.
Figure 6:
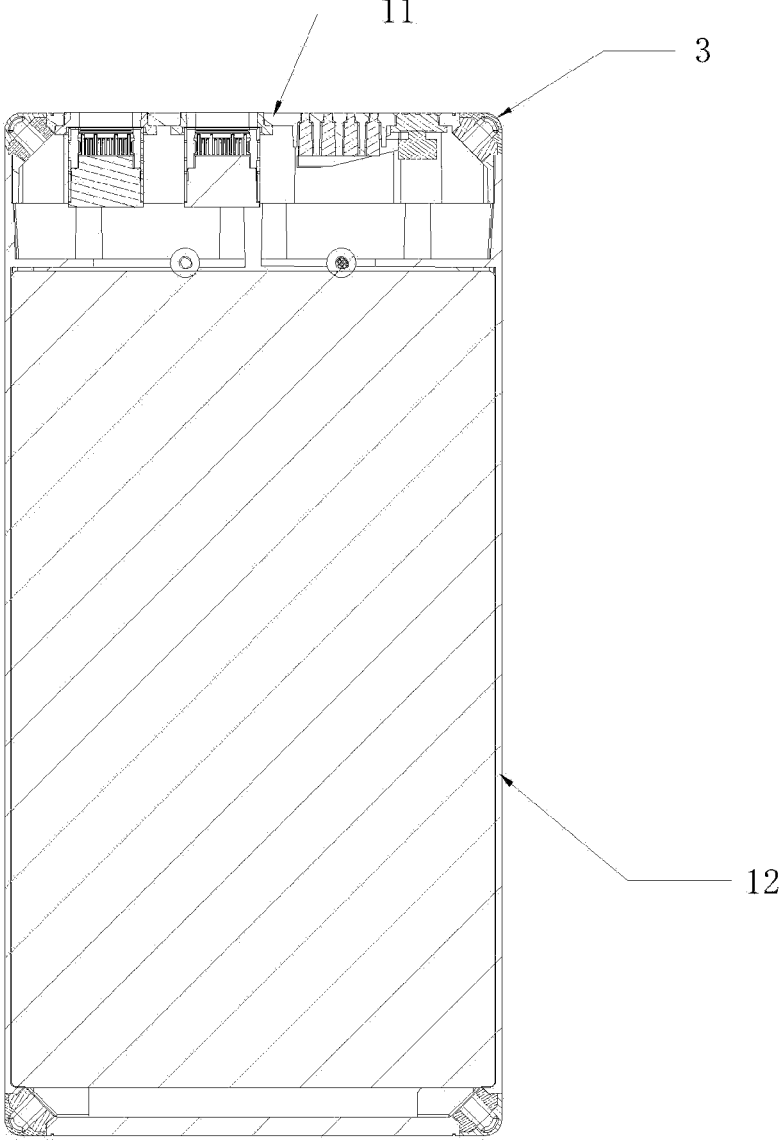
FIG. 6 is a schematic diagram of a cross-sectional view of the present disclosure.

As shown in FIGS. 4, 5 and 6, each of the four short edges of the shell 1 is provided with a gap 1a, in the embodiment, the gap 1a is a triangular gap (namely, chamfers are formed at four corners of the shell 1), the shape of the air bag soft body 3 is a triangular prism, and after the shell 1 and all the air bag soft body 3 are combined, the shell 1 forms a complete cuboid.

The air bag soft body 3 includes a support part 31 and a flexible part 32, the support part 31 is made of a PC material, the flexible part 32 is made of a silica gel material, the flexible part 32 is provided with the outer side of the support part 31 in a covering mode, the support part 31 and the flexible part 32 is provided with a hollow area 3b, the support part 31 is provided with an assembly part 3a, and the assembly part 3a is arranged to be inserted into the assembly groove 1b in the shell 1b.

The air bag soft body 3 is formed by an injection molding process, through combination of silica gel and PC, the soft body structure soft in middle and hard around is formed, meanwhile, the hollow areas 3b are provided in the air bag soft body 3, the hollow areas 3b may be semi-open or closed, which have the same effect as air bags, for absorbing impact, thereby achieving the effect of shock absorption.

In the embodiment, two sides of the top end of the upper shell body 11 is provided with the assembly grooves 1b, two sides of the bottom end of the lower shell body 12 is provided with the assembly grooves 1b, the air bag soft body 3 is provided with an assembly part 3a matched with the assembly groove 1b, and the air bag soft body 3 is composed of a support part and a soft bag on the outer side, the support part is provided with the assembly part 3a, and the assembly part 3a is arranged to be inserted into the assembly groove 1b, so as to fixedly connect the air bag soft body 3 with the upper shell body 11 or the lower shell body 12, for buffering impact of fall off.

As shown in FIGS. 2 and 3, in the embodiment, fixing grooves 124 are formed in the front side and rear side of the lower shell body 12, the fixing groove 124 is provided with a plurality of key-shaped bulges 125, a plurality of key-shaped holes 41 matched with the key-shaped bulges 125 are formed in the carbon fiber fixing sheet 4, the carbon fiber fixing sheet 4 may be embedded in the fixing groove 124, the key-shaped hole 41 and the key-shaped bulge 125 form a racetrack type glue position, the carbon fiber fixing sheet 4 is fixed in the fixing groove 124 through a double faced adhesive tape, the carbon fiber fixing sheet 4 has the advantages of high strength, high toughness and small weight, the elastic modulus (for measuring deformation resistance of a material) is 150-760 GPa, so that after the carbon fiber fixing sheet 4 is connected with the shell 1 through a key structure, the longitudinal and transverse impact resistance of the product may be enhanced, impact may be absorbed during falling, and then elements in the shell are protected.

The above are examples of the optimal implementation modes of the present disclosure, and the parts not described in detail are common knowledge of those of ordinary skill in the art. The protection scope of the present disclosure shall be subject to the content the claims, and equivalent variations made based on the technical inspiration of the present disclosure shall fall within the protection scope of the present disclosure.

What is claimed is:

1. An anti-falling mobile power supply, comprising a shell and an energy storage unit, the shape of the shell is a cuboid, each of the four short edges of the shell is all detachably provided with an air bag soft body, the front side and rear side of the shell are all detachably provided with a carbon fiber fixing sheet, the energy storage unit is provided in the shell, the top of the shell is provided with an interface and a switch, and the interface and the switch are electrically connected with the energy storage unit;

wherein the shell comprises an upper shell body and a lower shell body, and the upper shell body and the lower shell body are detachably connected;

wherein the upper surface of the lower shell body is open, the bottom of the upper shell body is provided with an inserting part, the inserting part is arranged to be inserted into the upper part of the lower shell body, the outer side of the inserting part is provided with a plurality of first buckles and a plurality of first clamping grooves, the upper part of the lower shell body is provided with a plurality of second clamping grooves and a plurality of second buckles, the second clamping groove is matched with the first buckle, and the second buckle is matched with the first clamping groove.

2. The anti-falling mobile power supply according to claim 1, wherein each of the four short edges of the shell is provided with a gap, and after the shell and all the air bag soft body are combined, a complete cuboid is formed.

3. The anti-falling mobile power supply according to claim 1, wherein the upper part of the lower shell body is provided with a plurality of strip-shaped grooves, the strip-shaped groove is vertically provided, the outer side of the inserting part is provided with a strip-shaped bulge, and the strip-shaped bulge is matched with the strip-shaped groove.

4. The anti-falling mobile power supply according to claim 1, wherein two sides of the top end of the upper shell body is provided with an assembly groove, two sides of the bottom end of the lower shell body is provided with an assembly groove, the air bag soft body is provided with an assembly part, and the assembly part is arranged to be inserted into the assembly groove.

5. The anti-falling mobile power supply according to claim 1, wherein the air bag soft body comprises a support part and a flexible part, the flexible part is provided with the outer side of the support part in a covering mode, the support part and the flexible part is provided with a hollow area, the support part is provided with an assembly part, and the assembly part is arranged to be inserted into an assembly groove in the shell.

6. The anti-falling mobile power supply according to claim 5, wherein the support part is made of a polycarbonate material, and the flexible part is made of a silica gel material.

7. The anti-falling mobile power supply according to claim 1, wherein the front side and rear side of the lower shell body are all provided with a fixing groove, and the carbon fiber fixing sheet is bonded in the fixing groove.

8. The anti-falling mobile power supply according to claim 7, wherein the fixing groove is provided with a plurality of substantially round bulges, the carbon fiber fixing sheet is provided with a plurality of substantially round holes, and the substantially round bulge is matched with the substantially round hole.

* * * * *